United States Patent [19]
Kurusu

[11] Patent Number: 5,506,432
[45] Date of Patent: Apr. 9, 1996

[54] METAL NITRIDE OXIDE SEMICONDUCTOR DEVICE

[75] Inventor: Toshirou Kurusu, Kagoshima, Japan

[73] Assignee: Sony Corporation, Tokyo, Japan

[21] Appl. No.: 310,706

[22] Filed: Sep. 22, 1994

[30] Foreign Application Priority Data

Sep. 24, 1993 [JP] Japan .................................. 5-261668

[51] Int. Cl.$^6$ .......................... H01L 29/792; H01L 29/76
[52] U.S. Cl. ........................ 257/324; 257/325; 257/411
[58] Field of Search .................................. 257/324, 325, 257/326, 410, 411

[56] References Cited

U.S. PATENT DOCUMENTS 4,198,252   4/1980   Hsu .......................................... 257/324

FOREIGN PATENT DOCUMENTS 59-63764   4/1984   Japan ...................................... 257/324

Primary Examiner—Wael M. Fahmy
Attorney, Agent, or Firm—Hill, Steadman & Simpson

[57] ABSTRACT

A metal nitride oxide semiconductor device in which a defective peeling off of a silicon nitride film is prevented from occurring. The metal nitride oxide semiconductor device comprises a silicon nitride film provided in such a manner that, as viewed from the source and drain regions, an edge of the silicon nitride film on the sides of the source and drain regions is located on the outer side of the inner side plane of the field insulating film surrounding the MNOS transistor.

4 Claims, 5 Drawing Sheets

1 μm or longer

1 μm or shorter

METAL NITRIDE OXIDE SEMICONDUCTOR DEVICE

BACKGROUND OF THE INVENTION

The present invention relates to a metal nitride oxide semiconductor (MNOS) device. More particularly, the present invention relates to an MNOS device having a gate dielectric comprising a silicon nitride (hereinafter referred to simply as "SIN") film formed on the surface of a silicon oxide film.

An MNOS device comprises a double-layer structured gate dielectric composed of a silicon oxide film and an SiN film. The device is suitable for use in, for example, charge-coupled devices (CCDs). When a CCD has a gate dielectric which consists of a silicon oxide film alone, the signal charge is not always transferred smoothly because it is difficult to form the silicon oxide film with a uniform thickness, the silicon oxide film being positioned under the first transfer electrode of polysilicon and the second transfer electrode of polysilicon. Such a problem can be overcome by providing a double-layered gate dielectric comprising a silicon oxide film and a SiN film.

Accordingly, attempts have been made to provide a device having a double-layered gate dielectric comprising a silicon oxide film and an SiN film for CCDs. The insulated gate transistors as an output circuit and the like of CCDs has employed an MNOS transistor.

Referring to the cross section view of FIG. 3, the characteristics of an MNOS transistor source and drain regions is described below.

The MNOS transistor comprises a semiconductor substrate 1 having thereon a field insulating film 2, a silicon oxide film 3, and an SiN film 4. The silicon oxide film 3 and the SiN film 4 constitute a gate dielectric 5. A gate electrode 6 is formed on the SiN film 4, and a source region 7 as well as a drain region 8 are provided in the structure.

In the structure described above, the SiN film 4 provided under and in the vicinity of the gate electrode 6 is formed in such a manner that a margin of less than 1 μm may be established on the outer side of the gate electrode 6 to assure a sufficiently high resistance against insulation breakdown. Furthermore, the SiN film 4 provided on the field insulating film 2 is formed in such a manner that also a margin of less than 1 μm may be obtained on the region corresponding to the source region 7 and the drain region 8. FIG. 5 is a plan view showing the positional relationship of the field, the SiN film, the source S, the drain D, and the gate in a prior art MNOS transistor. The hatched portion corresponds to the portion having the SiN film thereon.

In a prior art MNOS device, however, as shown in FIGS. 6(A) and 6(B), peeling off of the film was found to occur frequently on the margin of the SiN film 4 sticking outward from the gate electrode 6 or on the marginal SiN film 4a extending from the field insulating film 2 to, for instance, the source region 7 or the drain region 8.

SUMMARY OF THE INVENTION

Figure 1A:
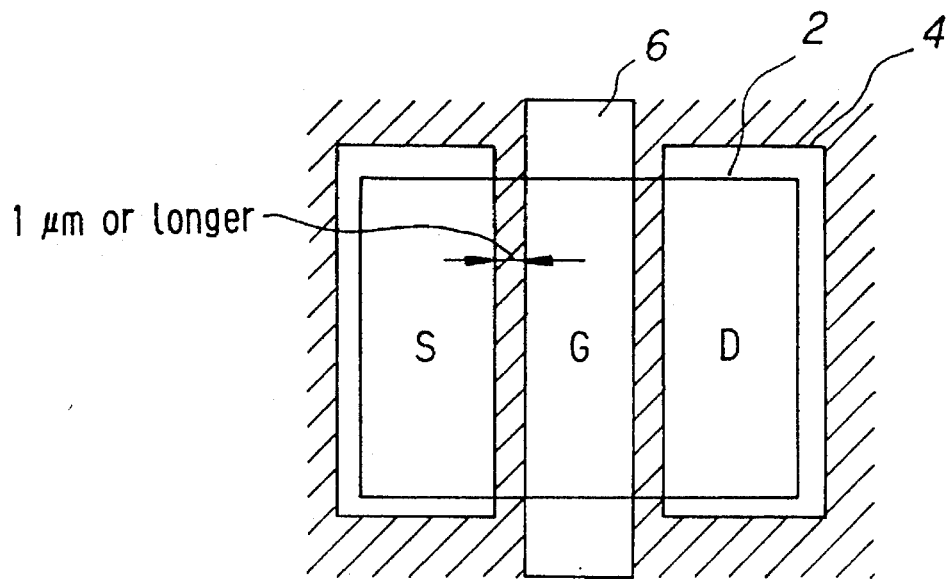
FIGS. 1(A) and 1(B) are a plan view and a sectional view, respectively, of an MNOS device according to an embodiment of the present invention.

In the light of the aforementioned circumstances, the present inventors have extensively studied the cause of the problems. As a result, it has been found that a part of the impurities that have been incorporated into the structure at a high dose (e.g., at a dose of $1.0 \times 10^{15}/cm^2$) by ion implantation to form the source region 7 and the drain region 8 intrudes into the marginal portion of the SiN film 4 to physio-chemically modify the SiN film 4. Thus, the SiN film 4 undergoes separation (peeling) due to the hardening and the like which occurs by the deterioration of the film.

Accordingly, the present inventors conducted experiments comprising ion implantation at a high dose (at a dose of $1.0 \times 10^{15}/cm^2$) while changing the width of the SiN film 4 margin sticking out from the resist 9 to see how the liability to peeling off changes with the width of the margin. In case of an SiN film having a thickness of 500 Å, peeling off of the film was found to occur more severely with decreasing margin width to less than 1 μm.

The same experiment was repeated except for changing the film thickness. The film was found to be more apt to suffer peeling off in case the margin width of the SiN film 4 was provided less than twenty times the thickness of the SiN film. On the contrary, peeling off was found to occur less in case the margin of the SiN film 4 was provided at a width of more than twenty times the thickness of the SiN film.

It was also found that peeling off occurs with higher probability when increasing the electric current of ion implantation. More specifically, peeling off does not occur too frequently in case of a conventional ion implantation applying a current of 300 μA. However, in a newly developed technology, which is already put to practical use, the ion implantation is effected at a higher current of, for example, 3 mA or even higher to increase the throughput. The film fabricated by this novel process was found to suffer frequent occurrences of peeling off. Hence, the problem of film separation could not be overcome.

SUMMARY OF THE INVENTION

An object of the present invention is to prevent defects such as peeling off of the SiN film from occurring on an MNOS device.

The above object can be accomplished by an MNOS device according to an aspect of the present invention, wherein the SiN film is provided in such a manner that, as viewed from the source and drain regions, an edge of the SiN film on the sides of the source and drain regions is located on the outer side of the inner side plane of the field insulating film surrounding the MNOS transistor.

The foregoing object can be accomplished by an MNOS device according to another aspect of the present invention, wherein the SiN film is extended in such a manner that an edge of the SiN film on the sides of the source and drain regions is located to the inner side (i.e., to the source region side and to the drain region side) of the inner side plane of the field insulating film surrounding the MNOS transistor by a length corresponding to twenty times or more the thickness of the SiN film.

The aforementioned object can be accomplished by an MNOS device according to still another aspect of the present invention where the SiN film under the gate electrode is provided in such a manner that the SiN film is extended to the outer side for a length corresponding to twenty times or more the thickness of the SiN film as measured from the edge of the gate electrode.

According to an MNOS device of a first aspect of the present invention referred to above, the SiN film is provided in such a manner that an edge on the sides of the source region and the drain region does not stick out to the source and the drain regions. Thus, impurities can be incorporated by ion implantation to form the source and drain regions with a resist completely covering the edge portion of the SiN film inside the source and drain regions. The peeling off of the SiN film due to the physio-chemical modification thereof, e.g., hardening which is caused by the addition of impurities, can be prevented from occurring.

According to an MNOS device of another aspect of the present invention described above, the SiN film is provided in such a manner that an edge of the SiN film on the sides of the source and drain regions sticks out to the inner side of the source and drain regions. However, since the SiN is extended in such a manner that the margin sticks out into the source drain region with a length of twenty times or more the thickness of the SiN film, there is no fear of causing peeling off of the SiN film sticking out to the inner side of the source and drain regions at the sides thereof. This is confirmed by the aforementioned experiment.

According to an MNOS device of a still other aspect of the present invention described above, the SiN film under the gate electrode is extended in such a manner that the margin extended out from the portion under the gate electrode be twenty times as long as the thickness of the SiN film or more. Accordingly, it is confirmed from the experiment that no peeling off occurs to the margin of the SiN film.

DESCRIPTION OF THE PREFERRED EMBODIMENTS

An MNOS device according to the present invention is described in further detail below referring to examples and the accompanying figures.

Figure 1B:
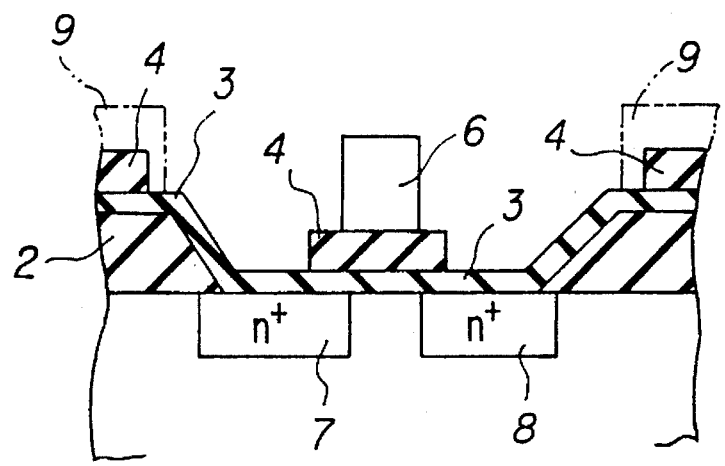

Referring to FIGS. 1(A) and 1(B), an MNOS device according to an embodiment of the present invention is described. FIG. 1(A) and FIG. 1(B) are a plan view and a sectional view, respectively, of the MNOS device.

The MNOS device comprises a 500 Å thick SiN film 4 formed in such a manner that an edge thereof on the sides of the source region 7 and the drain region 8 is located on the outer side of the inner plane of the field insulating film 2 surrounding the MNOS transistor. Accordingly, the ion implantation can be effected after completely covering the edges of the SiN film 4 on the source and drain sides with a resist 9 as shown with a sequence of a long line and two short dash lines in FIG. 1(B).

By thus eliminating the SiN portions extending from the sides of the source region 7 and the drain region 8 into the source region 7 and the drain region 8, impurities can be incorporated by ion implantation while completely covering the edge of the SiN film 4 inside the source region 7 and the drain region 8 with a resist 9. The occurrence of peeling off of the SiN film due to the deterioration of the film, e.g., hardening, can be circumvented in this manner.

The portion of the SiN film 4 provided under the gate electrode 6 is extended in such a manner that the edge at each side of the SiN film 4 is located outwardly of the gate electrode at a distance corresponding to a length of twenty times or more of the thickness of the SiN film 4.

Although a portion of the SiN film 4 under the gate electrode 6 sticks outwardly from the portion corresponding to the gate electrode 6, there is no fear of causing film separation because the margin extending out from the gate electrode 6 at both sides of the gate electrode is provided at a width of twenty times of more of the thickness of the SiN film. This is confirmed by the experiment described above.

In particular, this is effective to prevent defective film separation from occurring in case the electric current upon ion implantation is increased to, for example, 300 μA. The throughput can be increased by thus increasing the electric current without fear of suffering peeling off of the film.

Referring to step sequential sectional structures illustrated in FIGS. 4(A) to 4(G), the process for fabricating an MNOS device shown in FIGS. 1(A) and 1(B) according to the present invention is described below.

Figure 4A:
FIGS. 4(A) to 4(G) are a diagram showing the step sequential process steps of a process for fabricating an MNOS device according to an embodiment of the present invention.

A field insulating film 2 is formed selectively on the surface portion of a semiconductor substrate 1. The field insulating film 2 can be formed by either selectively etching a film deposited by normal pressure CVD, or by effecting a local oxidation process (LOCOS process). Thus is obtained a structure having a field insulating film 2 as shown in FIG. 4(A).

Figure 4B:
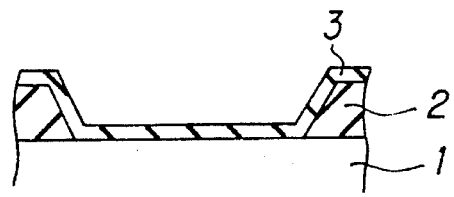

Then, as shown in FIG. 4(B), a silicon oxide film 3 is formed by hot oxidation to provide a constituent for a gate dielectric 5.

Figure 4C:
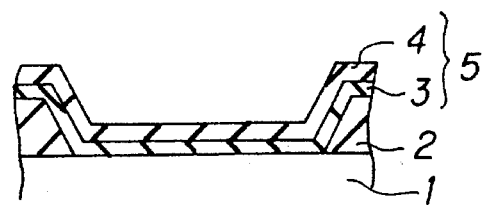

Another constituent of the gate dielectric 5, i.e. an SiN film 4, is deposited by a process such as reduced pressure CVD at a thickness of, for instance, 500 Å. The resulting structure is shown in FIG. 4(C).

Figure 4D:
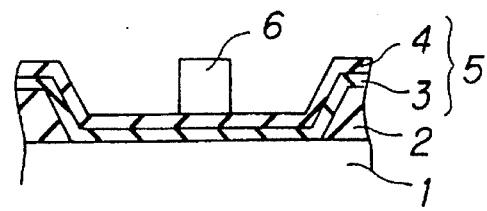

A polycrystalline silicon layer is deposited thereafter by, for example, reduced pressure CVD, and is selectively etched to provide a gate electrode 6 as shown in FIG. 4(D).

Figure 4E:
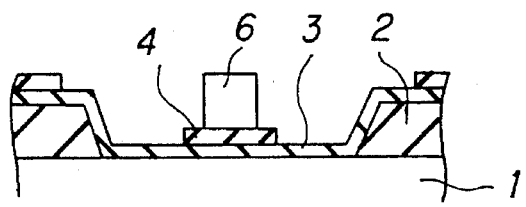
Figure 4F:
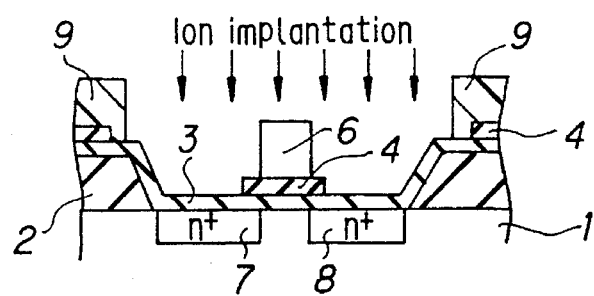

Subsequently, the SiN film 4 is patterned by selective etching as shown in FIG. 4(E).

A source region 7 and a drain region 8 are formed thereafter by means of ion implantation using a resist 9, the gate electrode 6, and the field insulating film 2 as the masks. Thus is obtained a structure shown in FIG. 4(F).

Figure 4G:
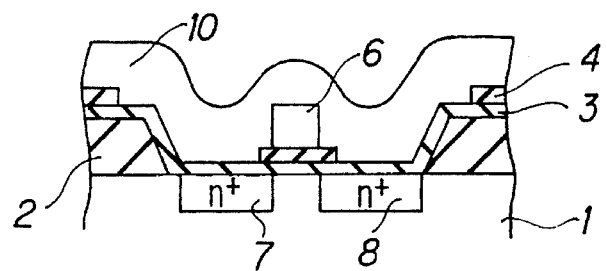
Figure 5:
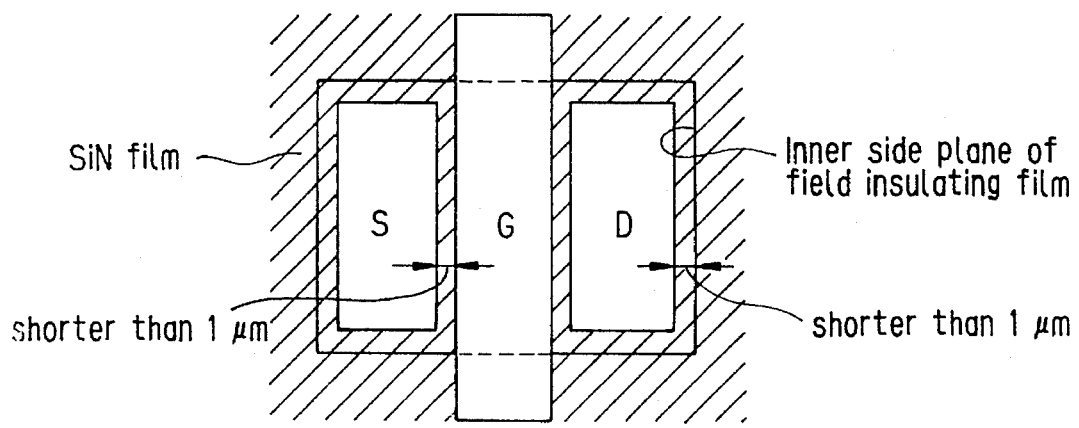
FIG. 5 is a plan view of a prior art MNOS device showing the positional relation among a field, an SiN film, a source, a drain, and a gate.
Figure 6A:
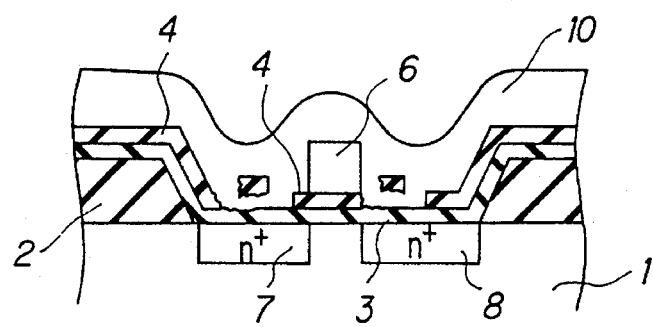
FIGS. 6(A) and 6(B) are each a plan view and a sectional view of a prior art MNOS device provided as an explanatory means to show the problems.
Figure 6B:
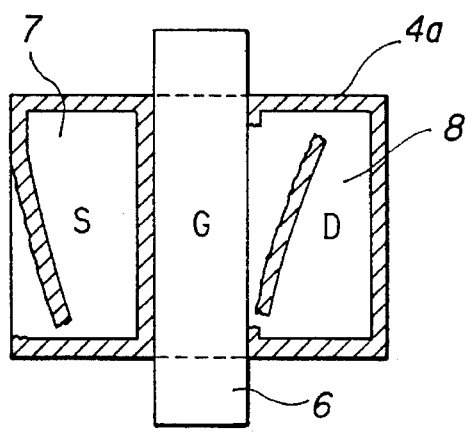
Figure 7:
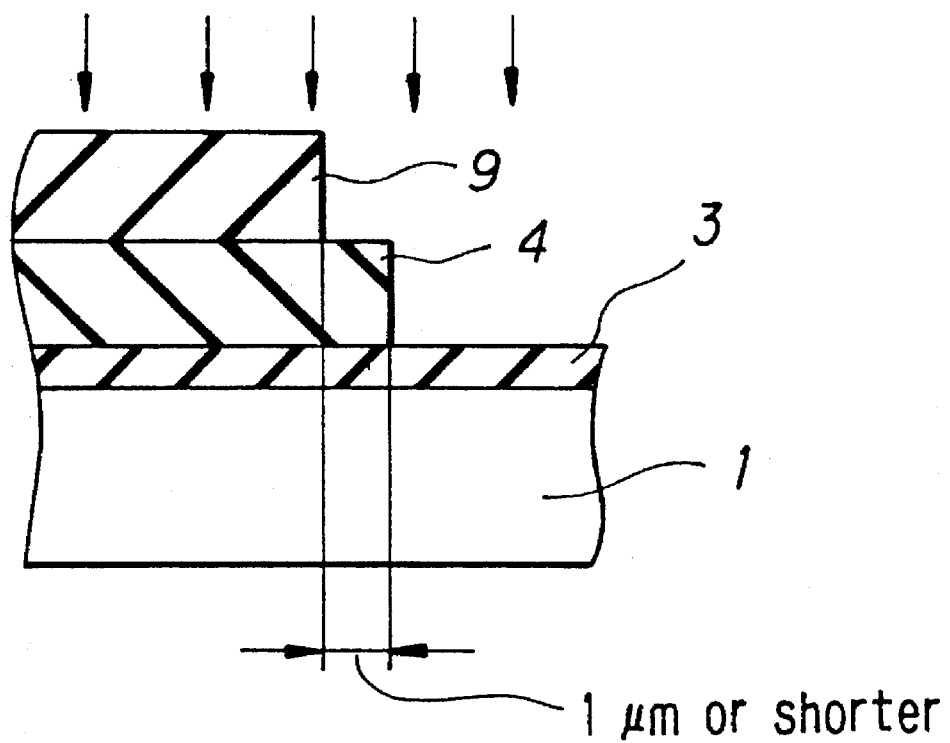
FIG. 7 is a partial cross section view of a prior art MNOS device provided as an explanatory means to explain the cause of the conventional problems.

Then, as shown in FIG. 4(G), a PSG (phosphosilicate glass) film 10, for instance, is formed. The same process steps utilized in an ordinary process for fabricating an MOS transistor are followed thereafter.

As viewed from the inside of the source and drain regions, it can be seen that the edges of the SiN film 4 above the sides of the source region 7(S) and the drain region 8(D) are located on the outer side of the inner side plane of the field insulating film 2 surrounding the MNOS transistor, and that the portion of the SiN film 4 under the gate electrode 6 is extended outwardly at each side in such a manner that the edge portion thereof is located at a distance from the respective side of the gate electrode 6 which is twenty times as long as the thickness of the SiN film or more.

By thus eliminating the SiN portions extending from the sides of the source region and the drain region into an area above the source region and the drain region, impurities can be incorporated by ion implantation while completely covering the edges of the SiN film inside the source region and the drain region with a resist. The peeling off of the SiN film due to the modification or the deterioration of the film, e.g., hardening, can be circumvented in this manner. Thus, as mentioned hereinbefore, an MNOS device free from separation of SiN film can be implemented by a process according to the present invention.

Furthermore, though a portion of the SiN film under the gate electrode sticks outwardly from the portion corresponding to the gate electrode, there is no fear of causing film separation because the margin extending out from the gate electrode is provided at a width of twenty times or more of the thickness of the SiN film. This is confirmed by the experiment described above.

Figure 2:
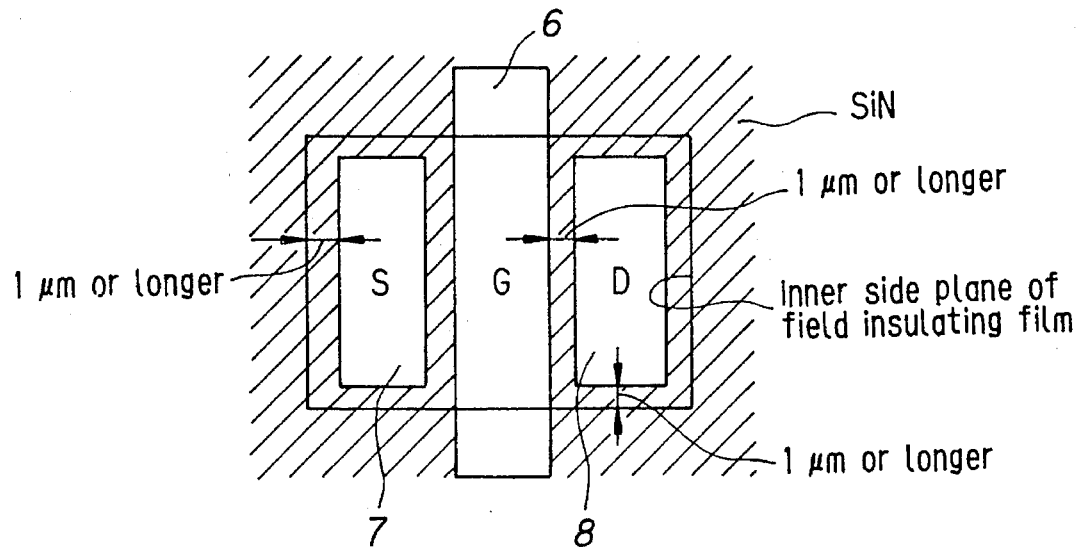
FIG. 2 is a plan view of an MNOS device according to another embodiment of the present invention.
Figure 3:
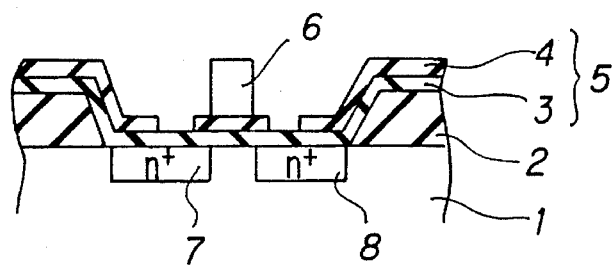
FIG. 3 is a sectional view of a prior art MNOS device.

Referring to the plan view of FIG. 2, an MNOS device according to another embodiment of the present invention is described below.

The MNOS device comprises an SiN film 4 which is extended in such a manner that an edge of the SiN film 4 above the sides of the source region 7 and the drain region 8 is located on the inner side of the inner side plane of the field insulating film 2 surrounding the MNOS transistor by a length corresponding to twenty times or more the thickness of the SiN film 4. Since the margin of the SiN film 4 extending out inside the source region 7 and the drain region 8 is provided at a length of 1 μm or longer, i.e. twenty times or more of the thickness (500 Å) of the SiN film in a manner similar to the case of the SiN film 4 provided under the gate electrode 6, there is no fear of causing film separation.

Conclusively, as mentioned above, the SiN film in the MNOS device according to the present embodiment is provided in such a manner that an edge of the SiN film on the sides of the source and drain regions sticks out to the inner side of the source and drain regions. However, since the SiN is extended in such a manner that the margin sticks out above the source and drain regions with a length of twenty times or more the thickness of the SiN film, there is no fear of causing peeling off of the SiN film sticking out to the inner side of the source and drain regions at the sides thereof. This is already clarified by the aforementioned experiment.

While the invention has been described in detail and with reference to specific embodiments thereof, it will be apparent to one skilled in the art that various changes and modifications can be made therein without departing from the spirit and scope thereof.

What is claimed is:

1. A metal nitride oxide semiconductor device, comprising:

a semiconductor substrate;

source and drain regions formed at and extending below a portion of a surface of the semiconductor substrate in spaced-apart relationship from one another to define a channel region therebetween;

a field-insulating film on said surface of said semiconductor substrate, said field-insulating film having an edge which surrounds at least the metal nitride oxide semiconductor device to electrically isolate the device from other elements formed on the surface of the semiconductor substrate;

a silicon oxide film formed over the channel region, the source and drain regions, and at least a portion of the field-insulating film at said edge and outwardly of said edge relative to said device;

a silicon nitride film formed on said silicon oxide film, a first portion of said silicon nitride film being formed above said channel region but stopping short of said edge of said field-insulating film, and a second portion of said silicon nitride film being formed only outwardly of said source and drain regions and outwardly of said edge of said field insulating film and over at least a portion of said field-insulating film outwardly of said field-insulating film edge and, said first and second portions of said silicon nitride film having facing terminating edges which are spaced from one another to form a gap therebetween; and a gate electrode formed above said channel region on said first portion of said silicon nitride film.

2. A device according to claim 1 wherein portions of said first portion of said silicon nitride film lying underneath the gate electrode extending beyond edges of the gate electrode by a distance equal to or greater than twenty times a film thickness of said silicon nitride film.

3. A device according to claim 2 wherein portions of said first portion of said silicon nitride film extend over portions of said source and drain regions adjacent said channel region.

4. A metal nitride oxide semiconductor device, comprising:

a semiconductor substrate;

source and drain regions formed on and below a portion of a surface of the semiconductor substrate in spaced-apart relation from one another to define a channel region therebetween;

a field-insulating film on said surface of said semiconductor substrate and having an edge which surrounds at least the metal nitride oxide semiconductor device to electrically isolate the device from other elements formed on the surface of the semiconductor substrate;

a silicon oxide film overlying the channel region, source and drain regions, edge of the field-insulating film, and at least portions of the field-insulating film lying outwardly of the edge of the field-insulating film;

a silicon nitride film on said silicon oxide film and having a first portion overlying said channel region and a second portion overlying portions of said source and drain regions, said edge region of said field-insulating film, and at least portions of said field-insulating film outwardly of said field-insulating film edge, and said first and second portions of said silicon nitride film having facing terminating edges which are spaced from one another to form a gap therebetween;

a gate electrode on said first portion of said silicon nitride film over said channel region; and portions of said first portion of said silicon nitride film extending outwardly of edges of said gate electrode by a distance equal to or more than twenty times a thickness of said silicon nitride film, and said second portion of said silicon nitride film over said source and drain regions extending from said edge of said field-insulating film toward said gate electrode by a distance equal to or greater than twenty times said thickness of said silicon nitride film.

* * * * *